United States Patent
Shapira et al.

(10) Patent No.: US 10,261,146 B2
(45) Date of Patent: Apr. 16, 2019

(54) UNIPOLAR FAST SPIN ECHO FOR PERMANENT MAGNET MRI

(71) Applicant: ASPECT IMAGING LTD., Shoham (IL)

(72) Inventors: Boaz Shapira, Rechovot (IL); Uri Rapoport, Moshav Ben Shemen (IL)

(73) Assignee: ASPECT IMAGING LTD., Shoham (IL)

( * ) Notice: Subject to any disclaimer, the term of this patent is extended or adjusted under 35 U.S.C. 154(b) by 810 days.

(21) Appl. No.: 14/700,207

(22) Filed: Apr. 30, 2015

(65) Prior Publication Data
US 2015/0338486 A1 Nov. 26, 2015

Related U.S. Application Data

(60) Provisional application No. 62/001,065, filed on May 21, 2014.

(51) Int. Cl.
| | | |
|---|---|---|
| *G01R 33/56* | (2006.01) | |
| *G01R 33/383* | (2006.01) | |
| *G01R 33/561* | (2006.01) | |
| *G01R 33/565* | (2006.01) | |

(52) U.S. Cl.
CPC ....... *G01R 33/383* (2013.01); *G01R 33/5617* (2013.01); *G01R 33/56563* (2013.01)

(58) Field of Classification Search
CPC .... G01R 33/56; G01R 33/561; G01R 33/383; G01R 33/5617; G01R 33/5615; G01R 33/586; G01R 33/50; G01R 33/5616; G01R 33/5676

See application file for complete search history.

(56) References Cited

U.S. PATENT DOCUMENTS

| | | | |
|---|---|---|---|
| 4,694,250 A | 9/1987 | Iwaoka et al. | |
| 5,268,640 A * | 12/1993 | Du | G01R 33/50 324/309 |

(Continued)

OTHER PUBLICATIONS

Norris et al., Online Motion Correction for Diffusion-Weighted Imaging Using Navigator Echoes: Application to RARE Imaging Without Sensitivity Loss, Magnetic Resonance in Medicine, 2001, 45:729-733.

(Continued)

*Primary Examiner* — Huy Q Phan
*Assistant Examiner* — Adam Clarke
(74) *Attorney, Agent, or Firm* — Pearl Cohen Zedek Latzer Baratz LLP

(57) ABSTRACT

A method of reducing artifacts produced during Fast Spin Echo measurements made using permanent magnet NMR instruments. The method includes applying encoding gradients that do not switch signs throughout the experiment. Prior to the 90° RF pulse, a strong RM gradient pulse is given to produce a dominant and constant residual magnetization. The encoding is done through the combination of encoding gradients with the aid of the 180° RF pulses of the echo train. A first constant encoding gradient is given before the first 180 pulse. Then two variable encoding gradients are provided after each 180 pulse; one applied prior to and one applied subsequent to each acquisition in the echo train.

10 Claims, 3 Drawing Sheets

(56) References Cited

U.S. PATENT DOCUMENTS

| | | | |
|---|---|---|---|
| 5,450,010 A * | 9/1995 | Van Der Meulen | ............................ G01R 33/56518 324/309 |
| 6,011,392 A * | 1/2000 | Zhou | ................ G01R 33/56554 324/307 |
| 6,771,069 B2 * | 8/2004 | Asano | ................ G01R 33/5615 324/309 |
| 6,781,375 B2 | 8/2004 | Miyazaki et al. | |
| 7,715,899 B2 | 5/2010 | Harvey et al. | |
| 8,593,141 B1 | 11/2013 | Radparvar et al. | |
| 2002/0149366 A1 * | 10/2002 | Asano | ................ G01R 33/561 324/307 |
| 2007/0249929 A1 * | 10/2007 | Jeong | ................ G01R 33/5615 600/410 |
| 2007/0276221 A1 | 11/2007 | Warntjes | |
| 2013/0178734 A1 * | 7/2013 | Wald | ...................... A61B 5/055 600/420 |
| 2015/0077102 A1 | 3/2015 | Mandal et al. | |
| 2016/0321424 A1 | 11/2016 | Otovos et al. | |

OTHER PUBLICATIONS

Ting et al., Thin-section MR Imaging of rat brain at 4.7T, JMRI 1992; 2:393-399.

* cited by examiner

UNIPOLAR FAST SPIN ECHO FOR PERMANENT MAGNET MRI

CROSS-REFERENCE TO RELATED APPLICATIONS

This application claims priority to U.S. Provisional Application No. 62/001,065 filed on May 21, 2014, which is incorporated herein by reference in its entirety.

FIELD OF THE INVENTION

This invention relates in general to methods for reducing artifacts in images produced by MRI. It particularly relates to pulse sequences for fast spin echo NMR in permanent magnet MRI systems.

BACKGROUND OF THE INVENTION

Fast Spin Echo (FSE) is a well-known NMR technique. A main source of artifacts in FSE is inaccurate phase gradient areas during the echo train. This inaccuracy is generally due to at least one of two factors. One of them is imperfections in the gradient power amplifier. In particular, the gradient power amplifier can produce inaccurate gradient shapes while switching the sign of the current. A second factor, unique to permanent magnet NMR systems, is residual magnetization (RM). The magnetic field gradients produced during the scan can induce a mirror field on the magnet pole pieces that remains for a significant amount of time (at least several minutes) after the gradients are turned off. This RM is approximately linear in space and adapts the field lines of the field gradient. Its actual value is a function of the gradient strength and of the inherent properties of the magnet. While the specific value of this gradient-dependent RM will vary from magnet to magnet, it is typically on the order of 0.1% of the gradient strength, and need only be measured once for any given magnet.

As is known in the art, $k=\int_0^T G(t)dt$, where k is a parameter commonly used to represent the k-space in MRI technology, where G(t) is a waveform for gradient pulses (e.g., a trapezoid shaped waveform) and G at a particular time t is the gradient strength (including the proton's gyromagnetic ratio), T is the duration of the gradient pulse. For G in units of Hz mm$^{-1}$, k is given in units of mm$^{-1}$. As is known in the art, when G is constant, k can be approximated to be k=GT. Reference is now made to FIG. 1, which illustrates a conventional FSE pulse sequence and gradient pulses, as is known in the art. Phase encoding (pe) along a phase axis $G_{pe}$ is shown in FIG. 1 with a pattern of a single echo train of having a length ETL. Hereinafter, the subscript and/or superscript pe stands for phase axis or phase encoded axis. For each cycle in the single echo train, two gradients are shown, an encoding gradient $k_i^{pe}$, and a reverse gradient that undoes the phase, $-k_i^{pe}$.

In order for FSE to work properly, two conditions of the FSE should be met:

(1) At each echo point of the FSE, the phase should vary as $\phi_{420}^{pe}=k_i^{pe} \cdot r^{pe}$, where $r^{pe}$ correspond to a position r along the phase encode axis.

(2) Between two 180° pulses of the FSE, the phase $\phi_{430}^{pe}$ should be constant. Ideally, $\phi_{430}^{pe}$, i.e.

$\phi_{430}^{pe}=(k_i^{\prime pe}-k_i^{pe}) \cdot r^{pe}=0$.

Typically, in an NMR/MRI instrument comprising a permanent magnet with pole pieces, neither of the above referenced conditions are fulfilled. Typically, after each encoding gradient $k_i^{pe}$, some residual magnetization (RM) gradient is produced. Moreover, due to typical imperfections in the gradient amplifier, the refocusing gradient will not necessarily produce the desired gradient, e.g., a gradient that has an identical shape as the encoding gradient but with opposite sign.

Thus, an FSE pulse sequence that overcomes the aforementioned problems with residual magnetization and that can compensate for imperfections in the gradient amplifier remains a long-felt, yet unmet need.

SUMMARY OF THE INVENTION

It is an object of this invention to provide an FSE pulse sequence that meets this need. The method disclosed herein comprises applying a residual magnetization (RM) gradient pulse prior to a 90° radio frequency (RF) excitation pulse (e.g., an initial RM gradient pulse), that is followed by a series of encoding gradient pulses. A single preparation gradient pulse is constant and given before the first 180° pulse, and the encoding gradient pulses are variable and applied in pairs following each 180° RF pulse, one prior to and one subsequent to each acquisition in the echo train. Relative to an amplitude of the initial RM gradient pulse, the amplitudes of the encoding gradient pulses can each have the same sign as the RM gradient pulse but are of smaller magnitude. In other words, there are no inverted or reversed gradient pulses in the pulse sequence, thereby keeping the RM constant throughout the measurement, where it acts as a small addition to the static field inhomogeneity for which, in preferred embodiments of the invention, activation of linear shim gradients is used to compensate. In addition, retention of the same sign of the gradient throughout the measurement sequence eliminates problems arising from non-idealities in the gradient amplifier.

It is therefore an object of this invention to disclose a method for reducing artifacts produced during a Fast Spin Echo (FSE) pulse sequence in a nuclear magnetic resonance instrument comprising a gradient power amplifier and a permanent magnet comprising a plurality of pole pieces, said permanent magnet characterized by a gradient-dependent residual magnetization $B_g$, said FSE pulse sequence comprising, in order: a 90° RF pulse characterized by a duration $T_{90}$; an echo train comprising a first 180° RF pulse, a first echo, and X−1 additional 180° RF pulses and X−1 additional echoes, X≥1, where X is the ETL; and a navigator RF pulse; wherein said method comprises: (a) applying a residual magnetization (RM) gradient pulse prior to said 90° RF pulse, said RM gradient pulse having amplitude $G_{RM}^{pe}$ along a phase axis with a positive or negative sign relative to an origin along said phase axis; (b) applying a shim gradient pulse of an amplitude that is at least sufficient to cancel any net effect on said gradient-dependent residual magnetization $B_g$ produced by said RM gradient pulse; (c) applying, prior to said first 180° RF pulse, a single preparation gradient pulse characterized by amplitude $G_{shift}^{pe} \leq G_{RM}^{pe}$, whereby for a gradient pulse duration T, $k_{shift}^{pe}=G_{shift}^{pe}T$ along said phase axis; (d) applying, for each 180° pulse i (1≤i≤X) in said echo train: (i) a first encoding gradient pulse applied subsequent to 180° pulse i and prior to echo i, said first encoding gradient pulse characterized by amplitude $G_{ai}^{pe}$ such that $k_{ai}^{pe}=G_{ai}^{pe}T$ along said phase axis; and (ii) a second encoding gradient pulse applied subsequent to said echo i and prior to 180° pulse i+1, said second encoding gradient pulse characterized by amplitude $G_{bi}^{pe}$ such that $k_{bi}^{pe}=G_{bi}^{pe}T$ along said phase axis, said second encoding gradient $G_{bi}^{pe}$ having an identical sign to the sign of the RM gradient pulse; and, (e) applying, subsequent to said navigator pulse, a final gradient pulse, said final gradient pulse having a sign identical to the sign of said RM gradient pulse.

It is a further object of this invention to disclose such a method, wherein said preparation gradient pulse is characterized by $$k_{shift}^{pe} \geq \frac{k_{max}^{pe}}{2}$$

where, $k^{pe}$ is incremented between $$\left[-\frac{k_{max}^{pe}}{2}, \frac{k_{max}^{pe}}{2}\right],$$

where $k_{max}^{pe}$, as is known in the art, defined by a desired spatial resolution, $dr^{pe}$, along the phase axis, such as:

$$k_{max}^{pe} = \frac{1}{dr^{pe}}.$$

The term "shift" can stand for shifting the encoded k's from the symmetry around its center k=0. At the conclusion of the phase encode in the unipolar FSE, k will be acquired between $$\left[-\frac{k_{max}^{pe}}{2} + \alpha, \frac{k_{max}^{pe}}{2} + \alpha\right],$$

where $\alpha$ is an asymmetric k shift parameter with the constrain of $\alpha \geq 0$. $\alpha$ leads to the definition:

$$k_{shift}^{pe} = \frac{k_{max}^{pe}}{2} + \alpha.$$

As is known in the art, k shift parameter can be input to an MRI device by, for example, a user. It is a further object of this invention to disclose such a method as defined in any of the above, wherein for $1 \leq i \leq X$, $k_{ai}^{pe} = G_{ai}^{pe} T = k_{shift}^{pe} + k_i^{pe}$, where $k_{ai}^{pe}$ is the imposed k value after the gradient, $G_{ai}^{pe}$, at position 320 in FIG. 2, and i is an index for a particular cycle in the sequence.

It is a further object of this invention to disclose such a method as defined in any of the above, wherein for $1 \leq i \leq X$, $k_{bi}^{pe} = G_{bi}^{pe} T = k_{shift}^{pe} - k_i^{pe}$, where $k_{bi}^{pe}$ is the imposed k value after the gradient, $G_{bi}^{pe}$, at position 320 in FIG. 2.

It is a further object of this invention to disclose such a method as defined in any of the above, wherein said final gradient pulse is characterized by $k = k_{shift}^{pe}$.

It is a further object of this invention to disclose such a method as defined in any of the above, wherein said FSE sequence is a 3D FSE sequence comprising an embedded 2D FSE sequence and an encoding axis $k^{pe2}$ along said slice axis, $N_{pe2}$ increments along said slice axis, j increments of $k^{pe2}$, $1 \leq j \leq N_{pe2}$, the $j^{th}$ increment of $k^{pe2}$ ($k_j^{pe2}$) being restricted to values in the range of $$-\frac{k_{max}^{pe2}}{2} + \beta \leq k_j^{pe2} \leq \frac{k_{max}^{pe2}}{2} + \beta,$$

where $$k_{max}^{pe2} = \frac{1}{dr^s},$$

$dr^s$ is a spatial resolution along the slice axis, and $\beta$ is an asymmetric $k^{pe2}$ shift; and further wherein said method additionally comprises: (a) applying a slice RM gradient pulse prior to said 90° RF pulse, said slice RM gradient pulse characterized by amplitude $G_M$ and a positive or negative sign along a slice axis, wherein $G_{RM}^s$ has a constant amplitude throughout said FSE sequence; (b) applying a slice shim gradient pulse of amplitude at least sufficient to cancel any net effect on said gradient-dependent residual magnetization $B_g$ produced by said slice RM gradient pulse; (c) applying slice gradient pulses of amplitude $G^s$ along said slice axis, substantially simultaneously with each of said 90° and 180° RF pulses in said FSE pulse sequence; (d) applying, prior to the first 180° pulse, a preparation encoding gradient having amplitude $G_0^{pe2} \leq G_{RM}^s$, thereby providing $k_0^{pe2} = G_0^{pe2} T$ along said slice axis; (e) for each 180° pulse i ($1 \leq i \leq X$) in said echo train: (i) applying, subsequent to said 180° pulse i and prior to echo i, a first encoding gradient pulse of amplitude $G_{aj}^{pe2}$, thereby providing $k_{aj}^{pe2} = G_{aj}^{pe} T$ along said slice axis; and (ii) applying a second encoding gradient pulse of amplitude $G_{bj}^{pe2}$ subsequent to said echo i, thereby providing $k_{bj}^{pe2} = G_{bj}^{pe2} T$ along said slice axis; and, (f) applying, subsequent to said navigator pulse, a final gradient pulse; further wherein the amplitude of each of said gradient pulses has a sign identical to, and an amplitude smaller than, the amplitude of said slice RM gradient pulse.

It is a further object of this invention to disclose such a method for reducing artifacts produced during a 3D FSE sequence, wherein k $$k_0^{pe2} = k_{shift}^{pe2} - \frac{G^s T_{90}}{2} \geq 0, k_{shift}^{pe2} = \frac{k_{max}^{pe2}}{2} + \beta,$$

and a restriction on the gradient along the slice axis;

$$G_{shift}^{pe2} = \frac{k_{shift}^{pe2}}{T}$$

where, $G_{shift}^{pe2} \leq G_{RM}^s$ and $G^s \leq G_{RM}^s$.

It is a further object of this invention to disclose such a method for reducing artifacts produced during a 3D FSE sequence as defined in any of the above, wherein $k_{aj}^{pe2} = G_{aj}^{pe2} T = k_{shift}^{pe2} + k_j^{pe2}$.

It is a further object of this invention to disclose such a method for reducing artifacts produced during a 3D FSE sequence as defined in any of the above, wherein $k_{bj}^{pe2} = G_{bj}^{pe2} T = k_{shift}^{pe2} - k_j^{pe2}$.

It is a further object of this invention to disclose such a method for reducing artifacts produced during a 3D FSE sequence as defined in any of the above, wherein said final slice gradient pulse 840 is characterized by providing $k = k_{shift}^{pe}$.

BRIEF DESCRIPTION OF THE DRAWINGS

The invention will now be described with reference to the drawings, wherein.

DETAILED DESCRIPTION OF THE PREFERRED EMBODIMENTS

In the following description, various aspects of the invention will be described. For the purposes of explanation, specific details are set forth in order to provide understanding of the invention. It will be apparent to one skilled in the art that there are other embodiments of the invention that differ in details without affecting the essential nature thereof. Therefore the invention is not limited by that which is illustrated in the figure and described in the specification, but only as indicated in the accompanying claims, with the proper scope determined only by the broadest interpretation of said claims.

The term "unipolar FSE" is used herein to describe an FSE sequence in which all encoding gradient pulses are of the same sign.

The expression "RM" is used herein to represent the term "residual magnetization."

For the sake of simplicity we assume that the gradient is constant such that k=GT. During a 2D FSE sequence comprising X iterations, $k_i^{pe}$ is incremented through the change in the gradient strength such that $k_i^{pe}=i\Delta G_{pe}T$, $1 \leq i \leq X$. Note that $k_i^{pe}$ is restricted to the range $$-\frac{k_{max}^{pe}}{2} + \alpha \leq k_i^{pe} \leq \frac{k_{max}^{pe}}{2} + \alpha$$

where $k_{max}^{pe}$ is defined by the desired resolution along the phase axis, $$dr^{pe} = \frac{1}{k_{max}^{pe}},$$

$dr^{pe}$ is the resolution of a pixel along the phase axis, and a is an asymmetric k shift.

Figure 1:
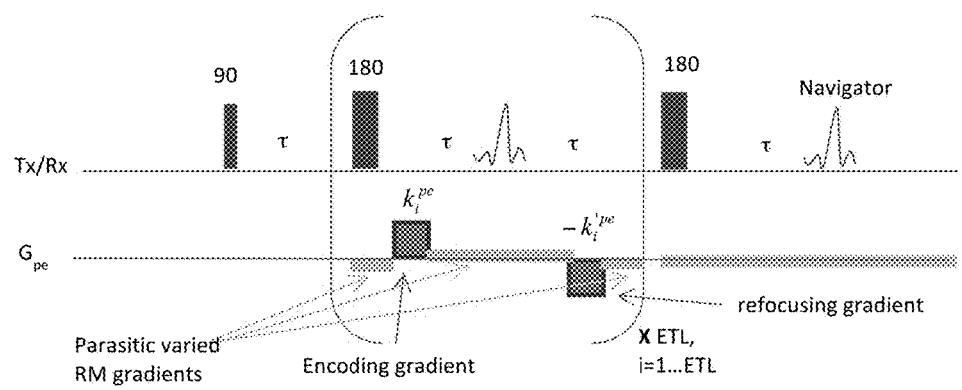
FIG. 1 shows the relevant encoding axis of a conventional FSE pulse sequence of a type known in the art.
Figure 2:
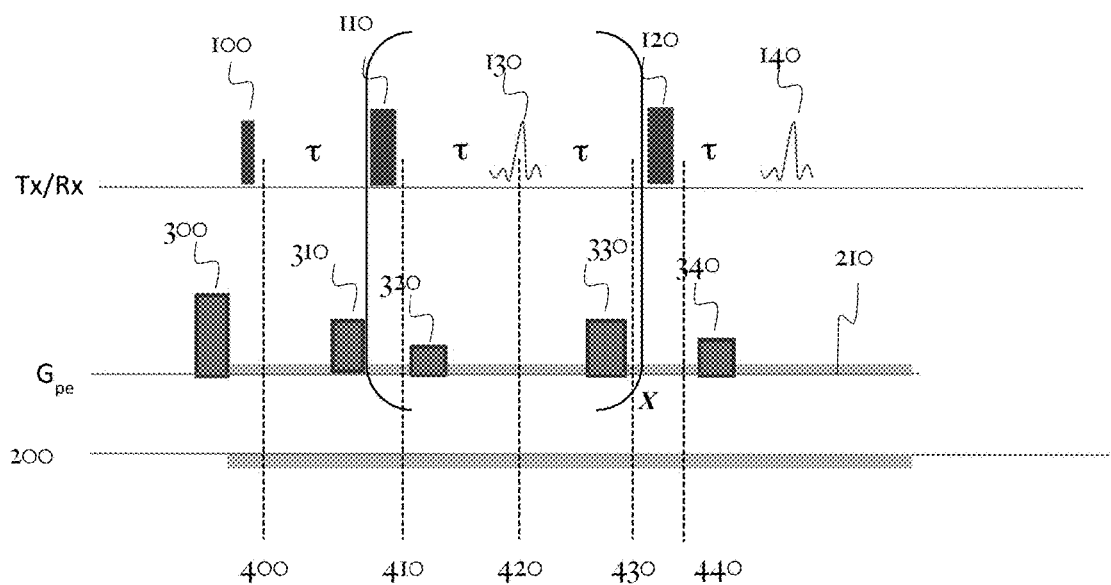
FIG. 2 shows the relevant encoding axis of an FSE pulse sequence according to one embodiment of the present invention.

Reference is now made to FIG. 2, which illustrates the pulse sequence of the present invention. The pulse sequence comprises a 90° RF pulse 100 followed by an echo train of length X=2, comprising a 180° RF pulse 110, and a final 180° navigator pulse 120. The symbol r represents the time delay between the 90° RF pulse and the 180° RF pulse, and the time delay between the 180° RF pulse and the echo 130. As is apparent to one of ordinary skill in the art, in various embodiments there can be X number of 180° RF pulse, where X (ETL) is an integer value greater than 1, each 180° RF pulse having a corresponding echo. The time delay between successive 180° RF pulses in the echo train will thus be 2τ, and the time between a given 180° RF pulse and the consequent echo will necessarily be τ as well. The parentheses in FIG. 2 indicate the portions of FIG. 2 that can be repeated an any number of times. Also shown in FIG. 2 are the gradient pulses that are part of the pulse sequence disclosed in the present invention, with their amplitudes along the phase axis. The gradient pulses include a gradient pulse 300 of amplitude $G_{RM}^{pe}$ produces a dominant residual magnetization (henceforth referred to as the "RM gradient pulse") applied before the 90° RF pulse; a preparation ("k shift") gradient pulse 310 applied prior to the first 180° RF pulse, a pair of encoding gradient pulses, first encoding gradient pulse 320 and second encoding gradient pulse 330, prior to and following the echo 130, respectively. The first and second encoding gradient pulses having amplitudes $G_a^{pe}$ and $G_b^{pe}$ respectively. The gradient pulses also include a final gradient pulse 340 between the navigator pulse 120 and the navigator echo 140. In preferred embodiments of the invention, gradient pulses 310 and 330 both have values of $k_{shift}^{pe}$. The parasitic inherent RM gradient 210 is constant during the pulse sequence, as explained below.

In various embodiments, as described above, there can be any number of 180° RF pulses each with a corresponding echo. In these embodiments, there can be a corresponding encoding gradient pulse pair for each 180° RF pulses and its corresponding echo.

The figure illustrates a central innovation of the present invention, namely, that the sequence all of the encoding gradient pulses are of the same sign as that of the RM gradient pulse (unipolar FSE). That is, the method does not involve any inverted or reversed gradient pulses. This innovation leads to two important consequences. First, the RM gradient is dominated by the largest gradient in the sequence along the phase axis, and does not change during the sequence. This gradient, having amplitude $G_{RM}^{pe}$ and produced before time 400, will therefore define the RM along the phase axis. A shim gradient 200 of opposite polarity is applied so that the net effect of the RM gradient will be zero. Second, the lack of a gradient of opposite sign guarantees accurate performance of the gradient amplifier.

In order to achieve the encoding pattern $k_i^{pe}$ at the echo time (130, FIG. 2) the following two relations must be maintained:

$$k_{ai}^{pe}=k_{shift}^{pe}+k_i^{pe}, \text{ and}$$

$$k_{bi}^{pe}=k_{shift}^{pe}-k_i^{pe}.$$

Note that the 180° RF pulse inverts the sign of $k_{shift}^{pe}$, so in preferred embodiments of the invention, $$k_{ai}^{pe}, k_{bi}^{pe} \geq 0 \left( k_{shift}^{pe} \geq \frac{k_{max}^{pe}}{2} \right).$$

The phase at time 410 in FIG. 2 is $\phi_{410}^{pe}=-k_{shift}^{pe} \cdot r^{pe}$. At the echo (time 420 in FIG. 2), the phase is $\phi_{420}^{pe}=(-k_{shift}^{pe}+k_{ai}^{pe}) \cdot r^{pe}$. Substitution of the expression for $k_{ai}^{pe}$ given above yields $\phi_{420}^{pe}=k_i^{pe} \cdot r^{pe}$, i.e. the desired phase at the echo. The phase at time 430 is $\phi_{430}^{pe}=(k_i^{pe}+k_{bi}^{pe}) \cdot r^{pe}$. Substitution of the expression for $k_{bi}^{pe}$ given above into the expression for $\phi_{430}^{pe}$ yields $\phi_{430}^{pe}=k_{shift}^{pe} \cdot r^{pe}$. Thus, the gradient pattern disclosed herein maintains the desired FSE phase conditions; at each echo, the phase goes as $k_i^{pe} \cdot r^{pe}$, and between each pair of 180° pulses, a constant phase is repeated, regardless of the value of $k_i^{pe}$.

With respect to the navigator pulse, the phase at time 440 in the sequence shown in FIG. 2 is given by $\phi_{440}{}^{pe} = -k_{shift}{}^{pe} \cdot r^{pe}$. With an additional gradient characterized by $k_{shift}{}^{pe}$, the overall phase during the navigator pulse will be zero, as is necessary for monitoring the field drift.

As noted above, the gradient-dependent RM $B_g$ depends on the characteristics of the particular magnet, and is typically on the order of 0.1% of the gradient strength. Thus, in order to be able to calculate the minimum amplitude necessary for the shim gradient pulse 200, it is necessary to know $B_g$ prior to application of the method disclosed herein. In general, $B_g$ is measured once for the specific NMR/MRI instrument of interest, using any appropriate method known in the art, and its value recorded for future reference.

The method for reducing artifacts disclosed herein as applied to 3D FSE is also contemplated by the inventors as being within the scope of the invention. The 3D FSE sequence comprises an embedded 2D FSE sequence; in 3D FSE, the slice axis serves as an additional phase encoding axis, $k^{pe2}$. For a number of increments $N_{pe2}$ along the slice axis and $1 \le j \le N_{pe2}$, $k_j^{pe2}$ is incremented by changing the slice gradient in a manner analogous to that described above for 2D FSE, with the analogous constraint that $$-\frac{k_{max}^{pe2}}{2} + \beta \le k_j^{pe2} \le \frac{k_{max}^{pe2}}{2} + \beta,$$

where $k_{max}^{pe}$ is defined by the desired resolution along the slice axis, $$k_{max}^{pe2} = \frac{1}{dr^s},$$

$dr^s$ is the spatial resolution along the slice axis, and $\beta$ is an asymmetric $k^{pe2}$ shift greater than or equal to zero. Note that the index j is incremented after each iteration through i (i.e. $k_j^{pe2}$ is incremented after each run through $k_i^{pe}$).

Figure 3:
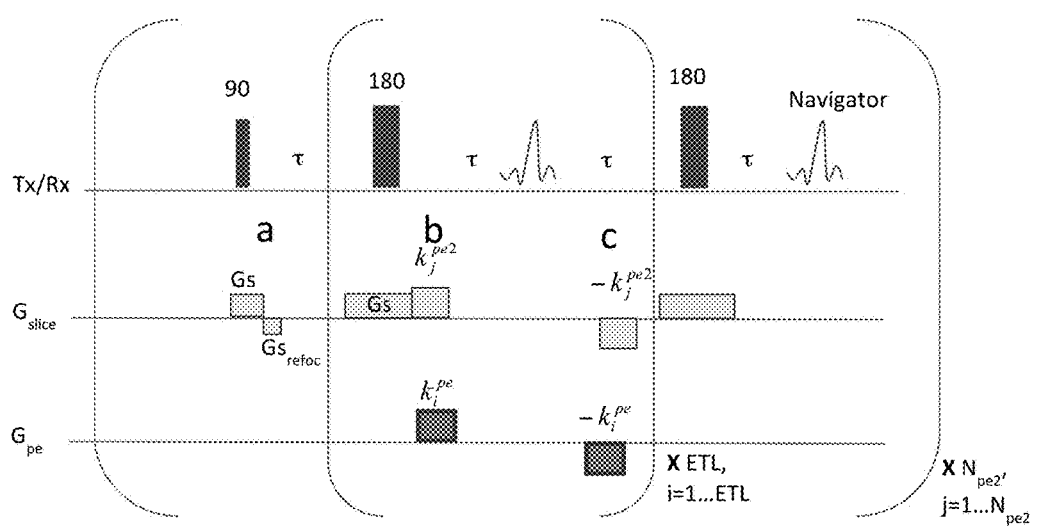
FIG. 3 shows the relevant encoding axes of a conventional 3D FSE pulse sequence of a type known in the art; and, FIG. 4 shows the relevant encoding axes of a 3D FSE pulse sequence according to one embodiment of the present invention.

Reference is now made to FIG. 3, which depicts a 3D FSE pulse sequence of a type known in the art. The slice select gradient, $G^s$, inverts its sign several times during the pulse sequence. At time a, after an excitation slice select pulse $G^S$, a refocusing slice select gradient $G_{refocus}{}^S$, is required that will have a reversed gradient sign with $$k = \frac{-G^s T_p}{2},$$

where $T_p$ is the duration of the excitation pulse (as 100 at FIG. 2). The slice select gradient is also active during the 180° pulse. At time b following the 180° RF pulse, an encoding gradient, $G_j^{pe2}$, provides $k_j^{pe2}$. At time c following the echo, a gradient pulse of opposite sign is applied in order to maintain the necessary conditions that k has the value of $k_j^{pe2}$ during the echo and that the overall phase should remain constant between each 180° pulses. 3D FSE techniques known in the art suffer from the same difficulties and problems discussed above for 2D FSE, in particular, the creation of artifacts as a result of non-constant RM and non-ideal gradient amplifier performance.

Figure 4:
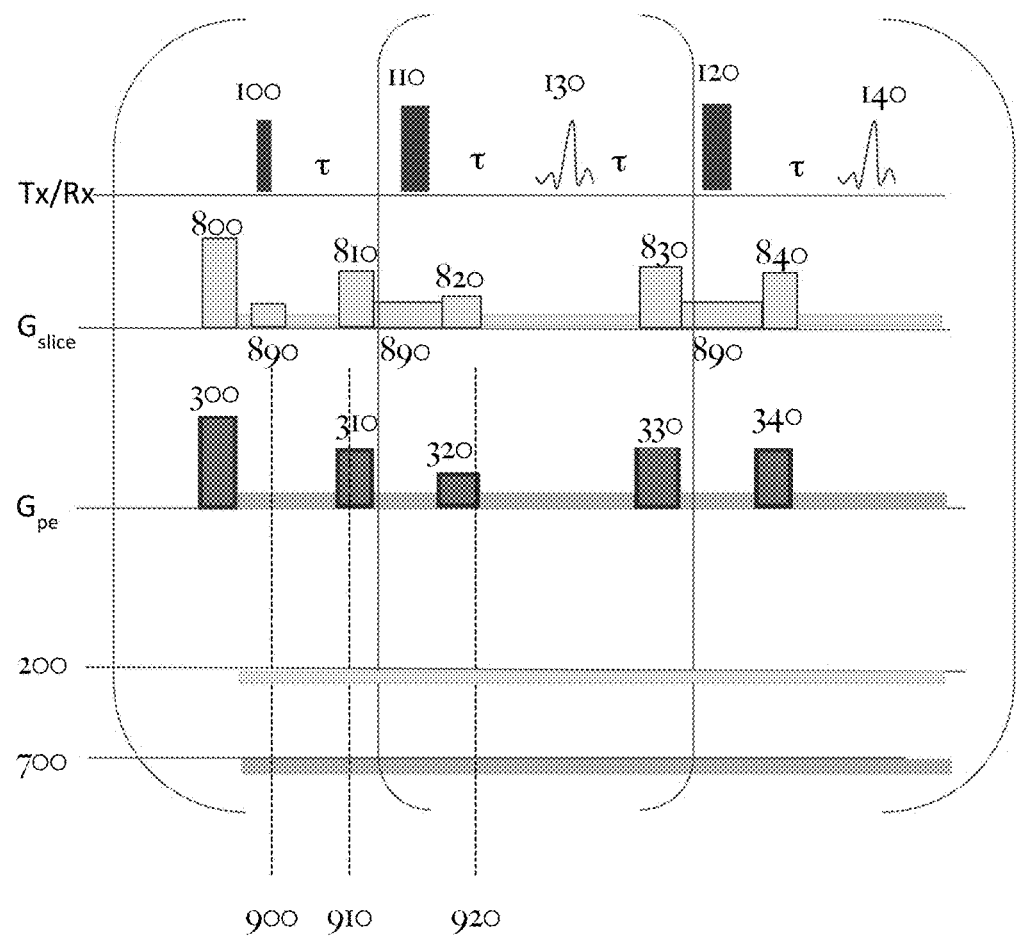

Reference is now made to FIG. 4, which depicts a 3D FSE sequence according to one embodiment of the current invention. As with the 2D FSE sequence illustrated in FIG. 2, the 3D FSE pulse sequence comprises a 90° RF pulse 100 followed by an echo train of length X=2, comprising a 180° RF pulse 110, and a final 180° navigator pulse 120. As was shown in FIG. 2, only one exemplary 180° RF pulse in the echo train 110 is illustrated in the figure; the parentheses indicate that it can be repeated an arbitrary (i.e. X) number of times. Also shown in FIG. 4 are gradient pulses that are part of the pulse sequence, with their amplitudes along the slice axis and phase axis. The gradient pulses include, a RM gradient pulse 300 (amplitude $G_{RM}{}^{pe}$ along the phase axis) and a slice RM gradient pulse 800 (amplitude $G_{RM}{}^S$ along the slice axis) prior to the 90° RF pulse. A preparation ("k shift") phase gradient provides $k_{shift}{}^{pe}$ 310, and a pair of encoding gradient pulses, $G_a^{pe}$ and $G_b^{pe}$. (320 and 330), prior to and following to and following the echo 130, provide $k_a^{pe}$ and $k_b^{pe}$ respectively, and a final gradient pulse 340 between the navigator pulse 120 and the navigator echo 140 are applied along the phase axis. In preferred embodiments of the invention, both gradient pulses, at 310 and at 330 provide the value $k_{shift}{}^{pe}$. Along the slice axis, slice gradient pulses 890 of amplitude $G^s$ are applied substantially simultaneously with the 90° and 180° RF pulses 100, 110, and 120. A preparation slice gradient pulse 810 is applied prior the first 180° RF pulse to give $$k_0^{pe2} = k_{shift}^{pe} - \frac{G^s T_{90}}{2}.$$

Pairs of encoding gradients, 820 and 830, having amplitudes $G_{aj}^{pe2}$ and $G_{bj}^{pe2}$, respectively, are applied along the slice axis prior to 820 and following 830 each of the echoes in the echo train 130, thereby providing $k_{aj}^{pe2}$ and $k_{bj}^{pe2}$. A slice navigator gradient pulse 840 is applied along the slice axis between the navigator pulse 120 and its echo 140. In preferred embodiments of the invention, the amplitude of pulse 840 provides $k_{shift}^{pe2}$. The amplitude $G^s$ of the refocusing pulse can be subtracted either at time 910 or it can be added after 180° RF pulse 110 (i.e. at time 920). Incrementation of the pulses is performed in an analogous manner to that described above for the case of 2D FSE.

As with the 2D FSE sequence presented above, a central innovative aspect of unipolar 3D FSE is that all of the gradient pulses have the same sign. The elimination of the need to invert the sign of the gradient pulses provides the same benefits in 3D FSE that it does in 2D FSE, namely, the elimination of artifacts due to RM and the non-ideal nature of the gradient amplifier. The combination of $k_{shift}^{pe2}$, $k_{aj}^{pe2}$, and the 180° RF pulse provides the required increment in $k_j^{pe2}$. The conditions for $k_{aj}^{pe2}$ and $k_{bj}^{pe2}$, analogous to the conditions for $k_Q$ and $k_{bi}^{pe}$ given above for 2D FSE, are $$k_{aj}^{pe2} = k_{shift}^{pe2} + k_j^{pe2} \text{ and}$$

$$k_{bj}^{pe2} = k_{shift}^{pe2} - k_j^{pe2}$$

In unipolar 3D FSE, as with unipolar 2D FSE, a strong constant gradient pulse is applied along the slice axis prior to 90° RF pulse 100 in order to produce constant RM throughout the run. The RM is canceled by implementing a slice shim gradient 700 along the slice axis in addition to the shim gradient 200 applied along the phase axis.

What is claimed is:

1. A method for reducing artifacts produced during a Fast Spin Echo (FSE) sequence in a nuclear magnetic resonance instrument comprising a gradient power amplifier and a permanent magnet comprising a plurality of pole pieces, said permanent magnet characterized by a gradient-dependent residual magnetization $B_g$, said FSE pulse sequence comprising, in order:

a 90° radio frequency (RF) pulse characterized by a duration of the 90° RF pulse ($T_{90}$);

an echo train comprising a first 180° RF pulse, a first echo, X-1 additional 180° RF pulses and X-1 additional echoes, where X≥1; and, a navigator pulse;

wherein said method comprises:

applying a residual magnetization (RM) gradient pulse prior to said 90° RF pulse, said RM gradient pulse having an amplitude $G_{RM}^{pe}$ along a phase axis and a positive or a negative sign relative to an origin along said phase axis;

applying a shim gradient pulse of amplitude at least sufficient to cancel any net effect on said gradient-dependent residual magnetization $B_g$ produced by said RM gradient pulse;

applying, prior to said first 180° RF pulse, a single preparation gradient pulse having an amplitude $G_{shift}^{pe}$ that is less than or equal to the RM gradient pulse amplitude $G_{RM}^{pe}$, whereby for a gradient pulse duration T, a k-value of the single preparation gradient pulse ($k_{shift}^{pe}$) is equal to the single preparation gradient pulse amplitude $G_{shift}^{pe}$ times the gradient pulse duration T along said phase axis;

applying, for each X-1 additional 180° RF pulses i (1≤i≤X) in said echo train:

a first encoding gradient pulse applied subsequent to said 180° pulse i and prior to echo i, said first encoding gradient pulse having an amplitude $G_{ai}^{pe}$ such that a k-value for the first encoding gradient pulse $k_{ai}^{pe}=G_{ai}^{pe}$ times T along said phase axis; and, a second encoding gradient pulse applied subsequent to said echo i and prior to said 180° pulse i+1, said second encoding gradient pulse $G_{bi}^{pe}$ having an amplitude $G_{bi}^{pe}$ such that a k-value for the second encoding gradient pulse $k_{bi}^{pe}=G_{bi}^{pe}$ times T along said phase axis, said second encoding gradient $G_{bi}^{pe}$ having an identical sign to the sign of said RM gradient pulse; and, applying, subsequent to said navigator pulse, a final gradient pulse, said final gradient pulse having a sign identical to the sign of said RM gradient pulse;

obtaining a magnetic resonance images based on the FSE sequence.

2. The method according to claim 1, wherein said preparation gradient pulse is characterized by $k_{shift}^{pe} \geq k_{max}^{pe}/2$, where $k^{pe}$ is being incremented between $[-k_{max}^{pe}/2, k_{max}^{pe}/2]$ $k_{max}^{pe}$ is defined by the required spatial resolution, $dr^{pe}$, along the phase axis, such as: $k_{max}^{pe}=1/dr^{pe}$.

3. The method according to claim 1, wherein for 1≤i≤X, $k_{ai}^{pe}=G_{ai}^{pe}T=k_{shift}^{pe}+k_i^{pe}$, where $k_{ai}^{pe}$, is the imposed k value after the gradient, $G_{ai}^{pe}$.

4. The method according to claim 1, wherein for 1≤i≤X, $k_{bi}^{pe}=G_{bi}^{pe}T=k_{shift}^{pe}-k_i^{pe}$ where $k_{bi}^{pe}$, is the imposed k value after the gradient, $G_{bi}^{pe}$.

5. The method according to claim 1, wherein said final gradient pulse is characterized by $k=k_{shift}^{pe}$.

6. The method according to claim 1, wherein said FSE sequence is a 3D FSE sequence comprising:

an embedded 2D FSE sequence;

an encoding axis $k^{pe2}$ along said slice axis;

$N_{pe2}$ increments along said slice axis;

j increments of $k^{pe2}$, 1≤j≤$N_{pe2}$, the $j^{th}$ increment of $k^{pe2}$ ($k_j^{pe2}$) being restricted to values in the range of $$-\frac{k_{max}^{pe2}}{2} + \beta \leq k_j^{pe2} \leq \frac{k_{max}^{pe2}}{2} + \beta,$$

where $$k_{max}^{pe2} = \frac{1}{dr^s},$$

$dr^s$ is a spatial resolution along the slice axis, and β is an asymmetric $k^{pe2}$ shift;

and further wherein said method additionally comprises:

applying a slice RM gradient pulse prior to said 90° RF pulse, said slice RM gradient pulse having an amplitude $G_{RM}^s$ and a positive or negative sign along a slice axis, wherein said slice RM gradient pulse has a constant amplitude throughout said FSE sequence;

applying a slice shim gradient pulse having an amplitude that is at least sufficient to cancel any net effect on said gradient-dependent residual magnetization $B_g$ produced by said slice RM gradient pulse;

applying slice gradient pulses having an amplitude $G^s$ that is less than or equal to the amplitude of the slice RM gradient pulse $G_{RM}^s$ along said slice axis, substantially simultaneously with said 90° RF pulse and said 180° RF pulse in said FSE pulse sequence;

applying, prior to the first 180° pulse, a preparation encoding gradient having an amplitude $G_0^{pe2}$ that is less than or equal to the amplitude of the slice RM gradient pulse, such that a k-value of the preparation encoding gradient $k_0^{pe2}=G_0^{pe2}$ times T along said slice axis;

for each 180° pulse i (1≤i≤X) in said echo train:

applying, subsequent to said 180° pulse i and prior to echo i, a first encoding gradient pulse having amplitude $G_{aj}^{pe2}$, such that a k-value of the first encoding gradient $k_{aj}^{pe2}=G_{aj}^{pe2}$ times T along said slice axis; and, applying a second encoding gradient pulse having an amplitude $G_{bj}^{pe2}$ subsequent to said echo i, such that a k-value of the second encoding gradient $k_{bj}^{pe2}=G_{bj}^{pe2}$ times T along said slice axis; and, applying, subsequent to said navigator pulse, a final gradient pulse;

and further wherein all four of said gradient pulses have a sign identical to, and an amplitude smaller than, that of said slice RM pulse.

7. The method according to claim 6, wherein $$k_0^{pe2} = k_{shift}^{pe2} - \frac{G^s T_{90}}{2} \geq 0, k_{shift}^{pe2} = G_{shift}^{pe2} T \geq k_R^{pe2},$$

$$G_{shift}^{pe2} \leq G_{RM}^s, k_R^{pe2} = \frac{k_{max}^{pe2}}{2} + \beta,$$

and $G^s \leq G_{RM}^s$.

8. The method according to claim 6, wherein $k_{aj}^{pe2}=G_{aj}^{pe2}=k_{shift}^{pe2}+k_j^{pe2}$.

9. The method according to claim 6, wherein $k_{bj}^{pe2}=k_{shift}^{pe2}-k_j^{pe2}$.

10. The method according to claim 6, wherein said final slice gradient pulse is characterized by $k=k_{shift}^{pe2}$.

* * * * *